(12) United States Patent
Hopper et al.

(10) Patent No.: US 6,861,306 B1
(45) Date of Patent: Mar. 1, 2005

(54) METHOD OF FORMING A SPLIT-GATE MEMORY CELL WITH A TIP IN THE MIDDLE OF THE FLOATING GATE

(75) Inventors: Peter J. Hopper, San Jose, CA (US); Yuri Mirgorodski, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/293,039

(22) Filed: Nov. 13, 2002

Related U.S. Application Data

(62) Division of application No. 10/000,661, filed on Oct. 31, 2001, now Pat. No. 6,528,844.

(51) Int. Cl.[7] .......................................... H01L 21/8238
(52) U.S. Cl. ........................ 438/201; 438/211; 438/257
(58) Field of Search ................................ 257/314–321; 438/201, 211, 257, 258, 260–267

(56) References Cited

U.S. PATENT DOCUMENTS

| | | | |
|---|---|---|---|
| 4,203,158 A | 5/1980 | Frohman-Bentchkowsky et al. | 365/185 |
| 5,029,130 A | 7/1991 | Yeh | 365/185 |
| 5,045,488 A | 9/1991 | Yeh | 437/43 |
| 5,067,108 A | 11/1991 | Jenq | 365/185 |
| 5,087,583 A | 2/1992 | Hazani | 437/43 |
| 5,242,848 A | 9/1993 | Yeh | 437/43 |
| 5,278,087 A | 1/1994 | Jenq | 437/43 |
| 5,554,553 A | 9/1996 | Harari | 437/43 |
| 5,744,853 A * | 4/1998 | Quek et al. | 257/532 |
| 5,866,455 A * | 2/1999 | Wu | 438/255 |
| 5,972,750 A | 10/1999 | Shirai et al. | 438/257 |
| 6,136,652 A | 10/2000 | Hazani | 438/260 |
| 6,137,131 A * | 10/2000 | Wu | 257/309 |
| 6,242,308 B1 | 6/2001 | Hsieh et al. | 438/265 |

* cited by examiner

Primary Examiner—Hoai Pham
(74) Attorney, Agent, or Firm—Mark C. Pickering

(57) ABSTRACT

A split-gate FLASH memory cell is formed with a floating gate that has a tip in the middle of the floating gate. The method of the present invention forms the tip to have a substantially constant radius of curvature, tip angle, and distance to the overlying tunneling oxide. As a result, the tip of the present invention increases the localized enhancement of the electric field.

17 Claims, 8 Drawing Sheets

METHOD OF FORMING A SPLIT-GATE MEMORY CELL WITH A TIP IN THE MIDDLE OF THE FLOATING GATE

This is a divisional of application Ser. No. 10/000,661 filed Oct. 31, 2001 now U.S. Pat. No. 6,528,894.

BACKGROUND OF THE INVENTION

1. Field of the Invention

The present invention relates to split-gate FLASH memory cells and, more particularly, to a split-gate FLASH memory cell with a tip in the middle of the floating gate.

2. Description of the Related Art

An electrically-erasable, programmable read-only-memory (EEPROM) cell is a semiconductor memory structure that stores one of two logic states even when power is removed from the structure. A conventional EEPROM cell is a two-transistor device that includes a select transistor and a floating-gate memory transistor.

A split-gate FLASH memory cell is a type of EEPROM cell that merges the select transistor and the floating-gate memory transistor into a single transistor. In a split-gate FLASH memory cell, a merged gate functions as both the gate of the select transistor and the control gate of the memory transistor.

FIG. 1A shows a plan view that illustrates a prior-art, split-gate FLASH memory cell 100. FIG. 1B shows a cross-sectional view taken along line 1B—1B of FIG. 1A. In the example shown in FIGS. 1A and 1B, memory cell 100 is formed in a p-substrate 110 that includes a pair of conventionally-formed, spaced-apart, shallow trench isolation regions STI.

Memory cell 100 includes spaced-apart n+ source and drain regions 112 and 114 that are formed in substrate 110, and a channel region 116 that is defined between source and drain regions 112 and 114. Channel region 116, in turn, includes a first channel region 116A, a second channel region 116B, and a third channel region 116C.

As further shown in FIGS. 1A and 1B, memory cell 100 includes a layer of gate oxide 120 that is formed on substrate 110 over channel region 116, and a floating gate 122 that is formed on gate oxide layer 120 over first channel region 116A. In addition, memory cell 100 also includes a layer of tunneling oxide 124 that is formed on gate oxide layer 120 over second channel region 116B, the side walls of floating gate 122, and the top surface of floating gate 122.

Memory cell 100 further includes a merged gate 126 that is formed on gate oxide layer 120 over third channel region 116C, and tunneling oxide layer 124 over floating gate 122. The portion of merged gate 126 that is formed over third channel region 116C functions like the gate of a select transistor of a conventional EEPROM cell. In addition, the portion of merged gate 126 that is formed over first channel region 116A functions like the control gate of a floating-gate memory transistor of a conventional EEPROM cell.

In operation, after memory cell 100 has been erased, floating gate 122 is left with a first charge. When memory cell 100 is then read, ground is applied to substrate 110 and source 112, a first positive voltage is applied to drain region 114, and a second positive voltage is applied to merged gate 126.

The first positive voltage sets up a drain-to-source electric field, while the second positive voltage sets up a merged gate-to-substrate electric field. The merged gate-to-substrate electric field in first channel region 116A is defined by several factors. These factors include the voltage differential, the separation distance, the dielectric constants of the materials, and the first charge stored on floating gate 122.

Under the influence of the merged gate-to-substrate electric field, electrons are attracted to and accumulate at the surface of channel region 116. The accumulated electrons, in turn, allow electrons to flow from source region 112 to drain region 114 under the influence of the drain-to-source electric field. The electron flow is detected and read to be, for example, a logic high.

After memory cell 100 has been programmed, a second charge is placed on floating gate 122. Memory cell 100 is programmed by injecting electrons into floating gate 122. As a result, the second charge is more negative than the first charge. As above, when memory cell 100 is read, ground is applied to substrate 110 and source 112, the first positive voltage is applied to drain region 114, and the second positive voltage is applied to control gate 126.

The first positive voltage sets up the same drain-to-source electric field. The second positive voltage, however, sets up a different merged gate-to-substrate electric field in first channel region 116A. In this case, the electric field is much weaker due to the negative value of the second charge stored on floating gate 122.

The weaker merged gate-to-substrate electric field, in turn, fails to attract enough electrons to the surface of first channel region 116A to allow electrons to flow from source region 112 to drain region 114. The lack of electron flow is detected and read to be, for example, a logic low.

Memory cell 100 is erased by applying a third positive voltage to merged gate 126, and ground or a negative voltage to source region 112. (The substrate and drain regions can be grounded or floated.) The floating gate 122 will also receive a part of third positive voltage in accordance with capacitive coupling of the floating gate to merged gate 126, source 112, and substrate 110.

The potential difference between the floating gate 122 and merged gate 126 sets up an electric field which has a magnitude that is sufficient to cause electrons on floating gate 122 to tunnel through tunneling oxide layer 124 to merged gate 126 via the well known Fowler-Nordheim process. The magnitude of the merged gate-to-floating gate electric field across tunneling oxide layer 124 is greatest at the covered edge of floating gate 122 where a tip 130 is present.

One problem with memory cell 100 is that when a large number of cells are fabricated, such as when wafers of memory arrays are formed, it is difficult to precisely replicate the steps that are used to form tip 130. In a conventional fabrication process, one side of a tip is formed by an anisotropic etch (which is difficult to align), while the other side is formed by the bird's beak portion of a local oxidation of silicon (LOCOS)-grown field oxide region (which is difficult to control).

The conventional process also leads to variations in the polysilicon grain structure, the radius of curvature of tip 130, the angle of tip 130, and the distance from tip 130 to the overlying tunneling oxide. As a result, tip 130 can vary significantly from lot-to-lot, thereby providing an undesirably wide performance range.

Thus, there is a need for a method of forming a split-gate memory cell that provides a more controllable approach to fabricating the memory cell and, therefore, a narrower performance range.

SUMMARY OF THE INVENTION

The present invention provides a method of forming a split-gate memory cell that provides a more controllable approach to fabricating a tip on the floating gate of the memory cell. In accordance with the present invention, a memory cell, which is formed in a semiconductor material of a first conductivity type, includes spaced apart source and drain regions of a second conductivity type that are formed in the semiconductor material.

The memory cell also includes a channel region that is defined in the semiconductor material between the source and drain regions. The channel region includes a first channel region, a second channel region that adjoins the first channel region, and a third channel region that adjoins the second channel region.

The memory cell further includes a layer of first insulation material that is formed on the semiconductor material over the channel region, and a floating gate that is formed on the layer of first insulation material over the first channel region. The floating gate has side wall surfaces, a top surface, and a central tip that extends away from a central portion of the top surface of the floating gate.

The memory cell additionally includes a layer of second insulation material that is formed on the layer of first insulation material over the second channel region, the side wall surfaces of the floating gate, and the top surface of the floating gate. In addition, a merged gate is formed on the layer of first insulation over the third channel region, and the layer of second insulation over the floating gate.

A method of forming a split-gate FLASH memory cell includes the steps of forming a layer of first insulation material on the semiconductor material of a first conductivity type, and forming a layer of first conductive material on the layer of first insulation material. The method additionally includes the step of defining a first region on the layer of first conductive material, and a second region on the layer of first conductive material so that the first region is spaced apart from the second region.

The method further includes the step of etching the first region of the layer of first conductive material to form a first surface of the layer of first conductive material, and the second region of the layer of first conductive material to form a second surface of the layer of first conductive material. The method also includes the step of etching the layer of first conductive material to form a floating gate. The floating gate has side wall surfaces and the first and second surfaces.

In addition, a layer of second insulation material is formed on the layer of first insulation material, on the side wall surfaces of the floating gate, and over the first and second surfaces of the floating gate. Further, a merged gate is formed on the layer of second insulation material over the floating gate.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 2A is a plan view illustrating memory cell 200 in accordance with the present invention. FIG. 2B is a cross-sectional view taken along line 2B—2B of FIG. 2A. FIG. 2C is a cross-sectional view taken along line 2C—2C of FIG. 2A.

FIG. 7A Is a plan view illustrates memory cell 300 in accordance with the present invention. FIG. 7B is a cross-sectional view taken along line 7B—7B of FIG; 7A. FIG. 7C is a cross-sectional view taken along line 7C—7C of FIG. 7A.

DETAILED DESCRIPTION

Figure 1A:
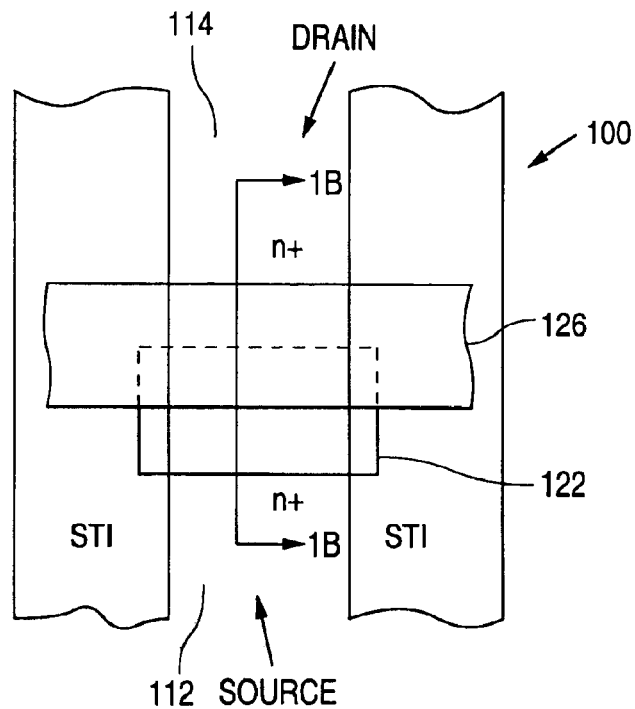
FIG. 1A is a plan view illustrating a prior-art, split-gate memory cell 100.
Figure 1B:
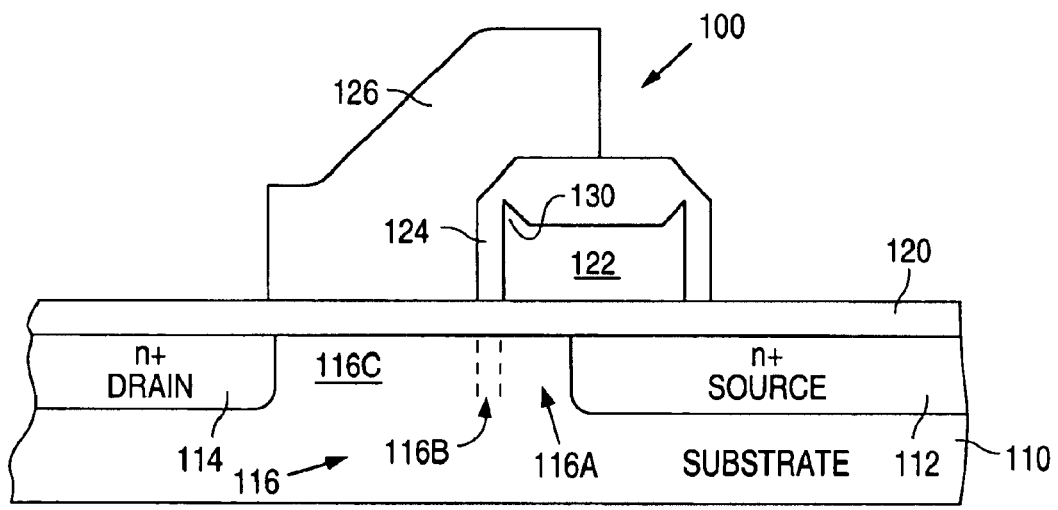
FIG. 1B is a cross-sectional view taken along line 1B—1B of FIG. 1A.
Figure 2A:
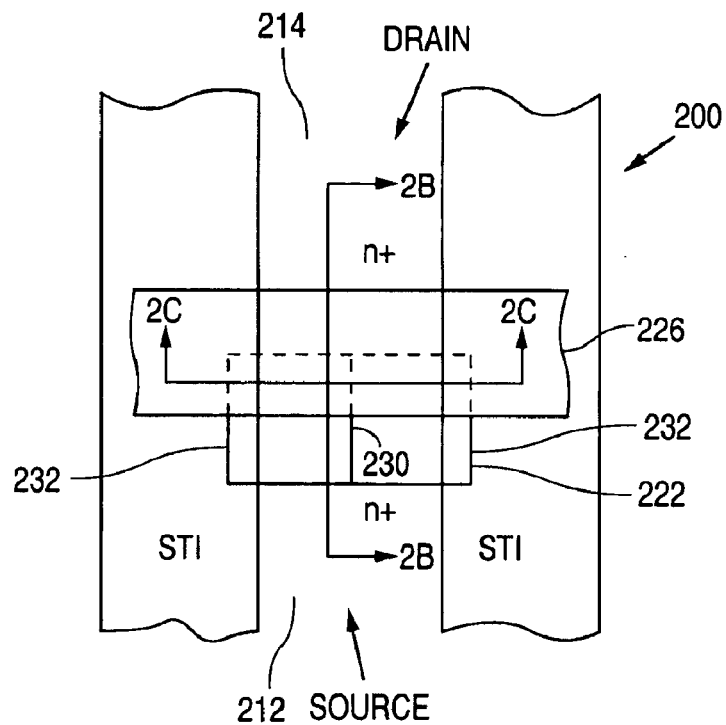
FIGS. 2A–2C illustrate the structure of a memory cell 200 in accordance with the present invention.
Figure 2B:
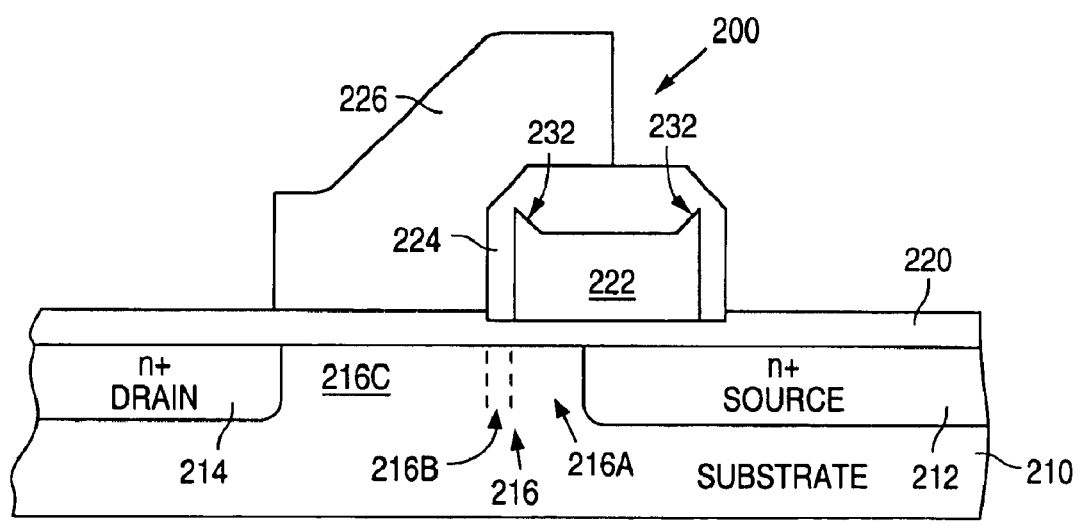
Figure 2C:
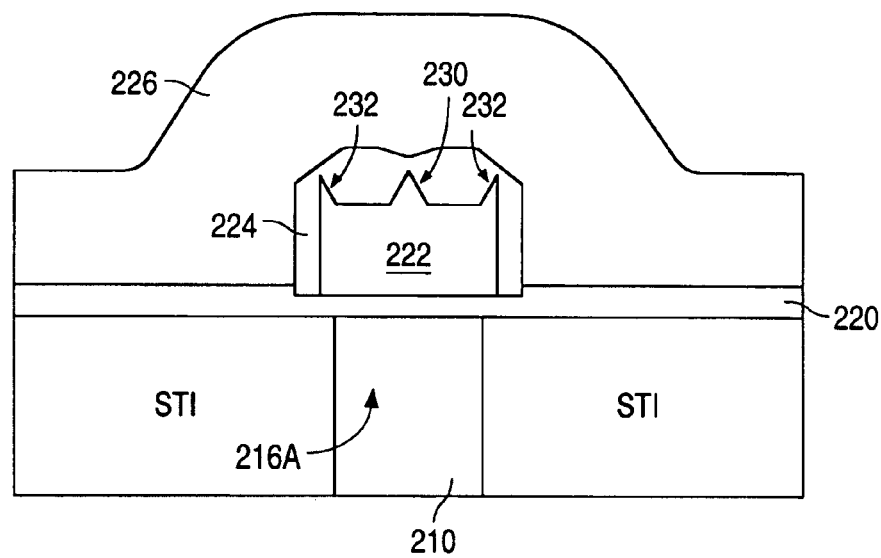

FIG. 2A shows a plan view that illustrates a split-gate memory cell 200 in accordance with the present invention. FIG. 2B shows a cross-sectional view taken along line 2B—2B of FIG. 2A. FIG. 2C shows a cross-sectional view taken along line 2C—2C of FIG. 2A. In the example shown in FIGS. 2A–2C, memory cell 200 is formed in a p-substrate 210 that includes a pair of conventionally-formed, spaced-apart, shallow trench isolation regions STI. (Cell 200 can alternately be formed in a well rather than a substrate.)

Memory cell 200 includes spaced-apart n+ source and drain regions 212 and 214 that are formed in substrate 210, and a channel region 216 that is defined between source and drain regions 212 and 214. Channel region 216, in turn, includes a first channel region 216A, a second channel region 216B, and a third channel region 216C.

As further shown in FIGS. 2A–2C, memory cell 200 includes a layer of gate oxide 220 that is formed on substrate 210 over channel region 216, and a floating gate 222 that is formed on gate oxide layer 220 over first channel region 216A. In accordance with the present invention, floating gate 222 includes a central tip 230 and two outer tips 232.

In addition, memory cell 200 also includes a layer of tunneling oxide 224 that is formed on gate oxide layer 220 over second channel region 216B, the side walls of floating gate 222, and the top surface of floating gate 222. Memory cell 200 further includes a merged gate 226 that is formed on gate oxide layer 220 over third channel region 216C, and tunneling oxide layer 224 over floating gate 222.

Memory cell 200 operates the same as memory cell 100 except that central tip 230 provides a larger electric field enhancement than tip 130 of memory cell 100.

FIGS. 3A–3F show cross-sectional views that illustrate a method of forming a split-gate FLASH memory cell in accordance with the present invention. In the example shown in FIG. 3A, the method of the present invention utilizes a conventionally-prepared, p-type semiconductor material 310, such as a well or a substrate. Material 310 has been formed to include a pair of spaced-apart shallow trench isolation (STI) regions and threshold adjust implants.

Figure 3A:
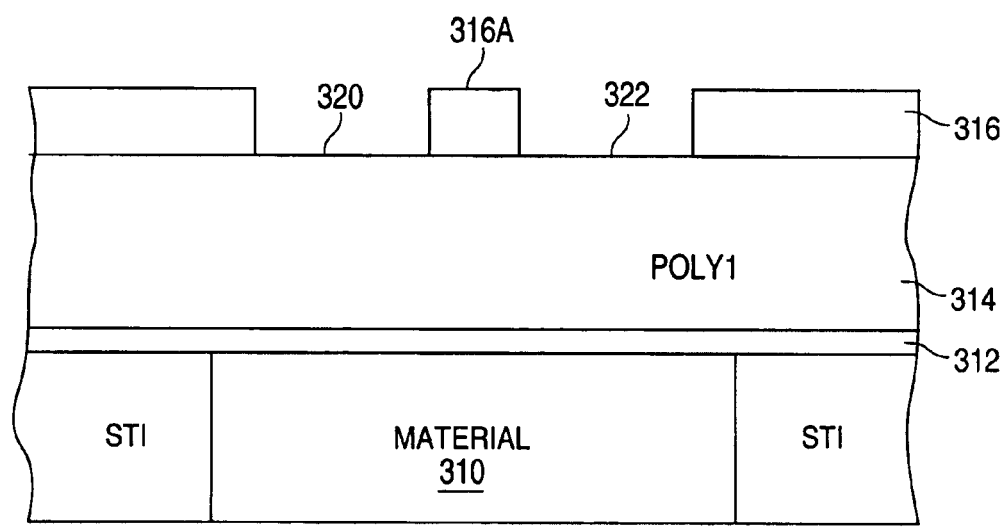
FIGS. 3A–3F are cross-sectional views illustrating a method of forming a split-gate FLASH memory cell in accordance with the present invention.

The method begins by forming a layer of insulation material 312, such as gate oxide, on material 310. Following this, a first layer of polysilicon (poly1) 314 is formed on insulation layer 312, and then doped with an n-type dopant. Next, a layer of masking material 316, such as nitride, is formed and patterned on poly1 layer 314 to expose first and second regions 320 and 322 on the surface of poly1 layer 314. As shown in FIG. 3A, first and second regions 320 and 322 are separated by a strip 316A of masking layer 316.

Figure 4:
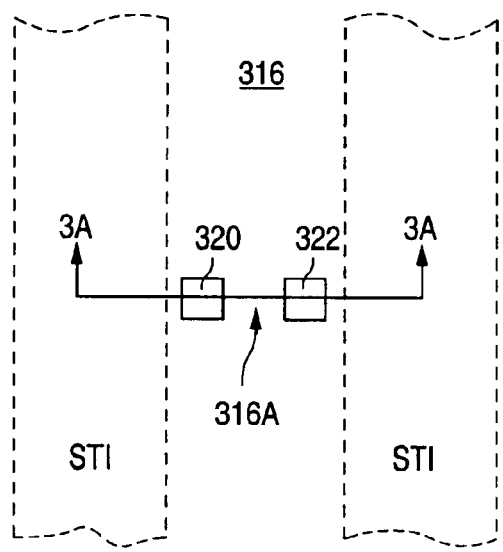
FIG. 4 is a plan view further illustrating the present method in accordance with the present invention.

FIG. 4 shows a plan view that further illustrates the present method in accordance with the present invention. The cross-sectional view shown in FIG. 3A is taken along line 3A—3A in FIG. 4. As shown in FIG. 4, after masking layer 316 has been patterned, first and second regions 320 and 322 of poly1 layer 314 are exposed.

Figure 3B:
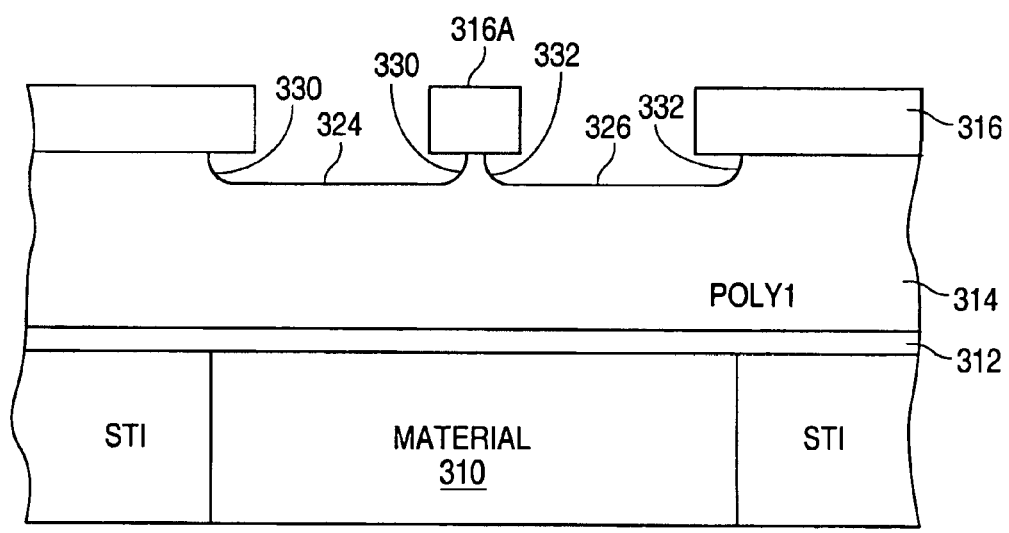

Referring to FIG. 3B, after masking layer 316 has been patterned, poly1 layer 314 is isotropically etched for a predetermined period of time. As shown in FIG. 3B, the isotropic etch undercuts masking layer 316 to form a first surface 324 and a second surface 326. The etch forms first surface 324 with a curved surface 330 that has a substantially constant radius of curvature, and second surface 326 with a curved surface 332 that has a substantially constant radius of curvature. Alternately, curved surfaces 330 and 332 can be tapered to have any shape by using a combination of isotropic and anisotropic etches.

Figure 3C:
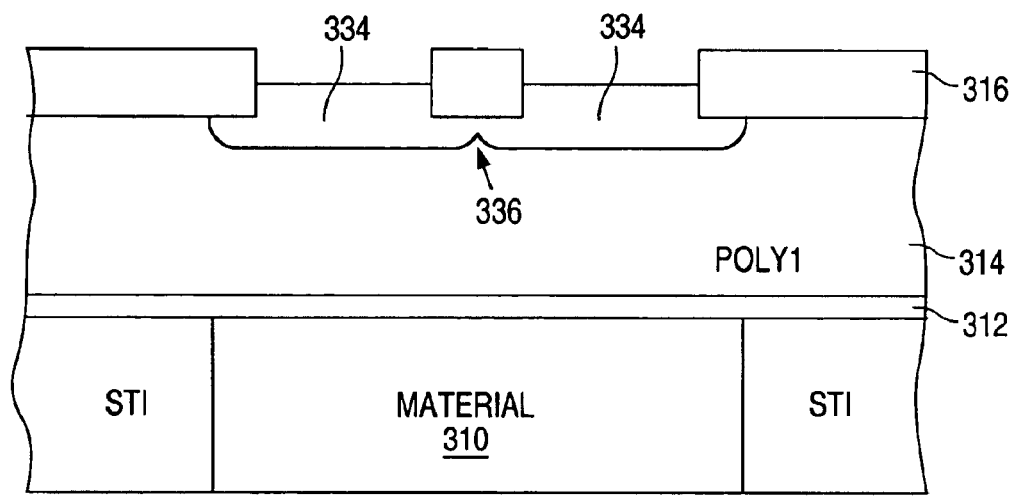

Referring to FIG. 3C, following the etch, poly1 layer 314 is oxidized for a predefined period of time to form a layer of oxide 334 on surfaces 324 and 326. The oxidation that forms oxide layer 334 consumes a portion of poly1 layer 314 at a substantially uniform rate so that when the region of poly1 layer 314 that underlies masking strip 316A is consumed, a central tip ridge 336 is formed. After this, masking layer 316 is removed.

Thus, in the present invention, tip ridge 336 is formed in a two step process where the etch is the first stage, and the oxidation is the second stage, completing the formation of the tip from both sides. The present invention allows a sharper, more efficient tip to be formed. The response of the shape of tip 336 to variations in the etching and oxidation steps essentially depends on the final oxide radius near the tip which, in the present invention, can be controlled (enlarged) by varying the polysilicon thickness and the parameters of the etching. In addition, tip profile stability can be enhanced by, and is a function of, the thickness of poly1 layer 314.

Figure 3D:
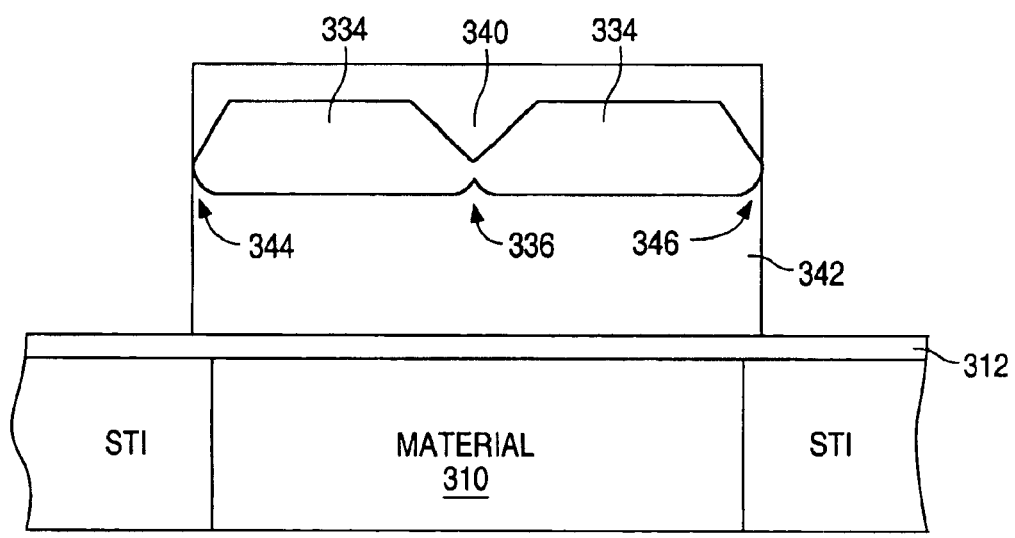

Referring to FIG. 3D, once masking layer 316 has been removed, a mask 340 is formed and patterned on oxide layer 334 to protect surfaces 324 and 326 of poly1 layer 314. Next, the exposed portion of poly1 layer 314 is etched until poly1 layer 314 is removed from the surface of the underlying insulation layer 312. The etch forms a floating gate 342, such as floating gate 222, with overlying oxide layer 334. In addition, the etch also forms a first perimeter tip 344 and a second perimeter tip 346.

Figure 5:
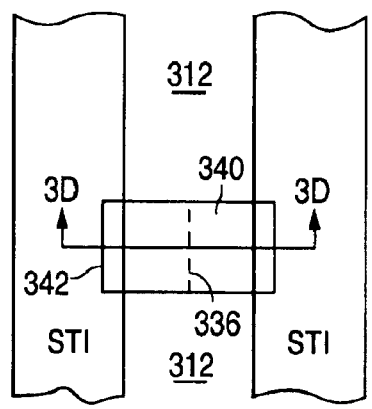
FIG. 5 is a plan view further illustrating the present method in accordance with the present invention.

FIG. 5 shows a plan view that further illustrates the present method in accordance with the present invention. The cross-sectional view shown in FIG. 3D is taken along line 3D—3D in FIG. 5. As shown in FIG. 5, when mask 340 has been patterned and poly1 layer 314 has been etched to form floating gate 342, insulation layer 312 is exposed.

Figure 3E:
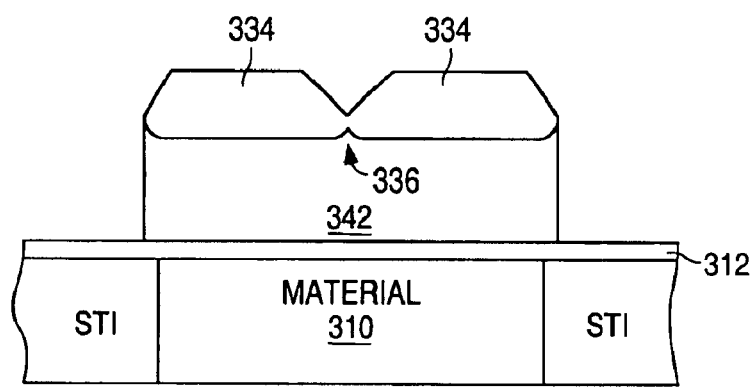

Referring to FIG. 3E, after the etch, mask 340 is removed, and the surface of layers 312 and 334 are cleaned. The cleaning step removes a small amount of oxide layer 334 which, in turn, exposes or nearly exposes tip 336.

Figure 3F:
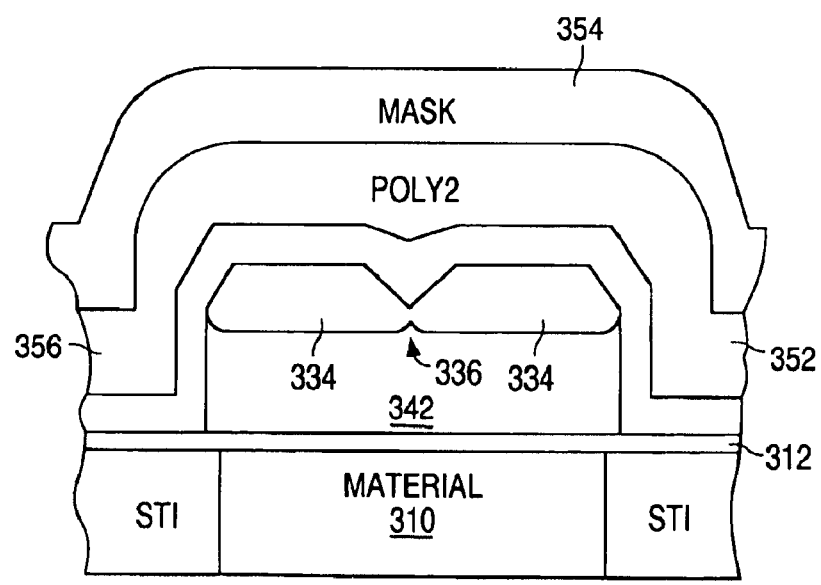

Referring to FIG. 3F, following the cleaning, a layer of insulation material 350, such as tunneling oxide, is deposited on the top surface of oxide layer 334. Insulation layer 350 is also formed on the side walls of floating gate 342, and on insulation layer 312. When insulation layer 312 and insulation layer 350 are the same material, such as oxide, the combined layers can be considered to be a single layer having different thicknesses.

After insulation layer 350 has been formed, a second layer of polysilicon (poly2) 352 is formed on insulation layer 350.

After this, a mask 354 is formed and patterned on poly2 layer 352. Once mask 354 has been patterned, the exposed portions of poly2 layer 352 are etched and removed from the underlying insulation layer 350 to form a merged gate/word line 356.

Figure 6:
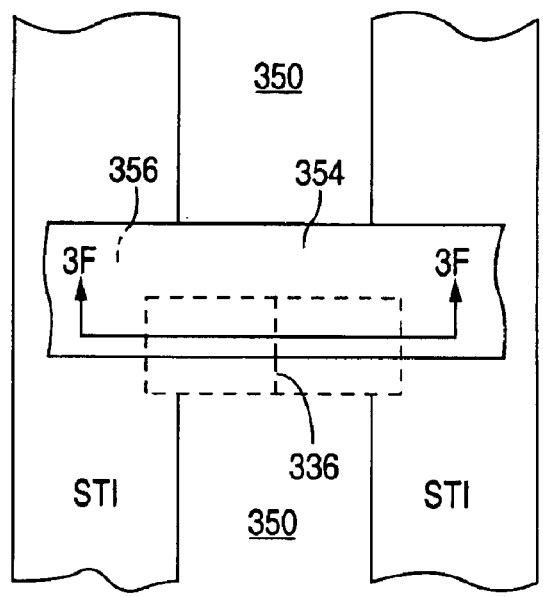
FIG. 6 is a plan view further illustrating the present method in accordance with the present invention.

FIG. 6 shows a plan view that further illustrates the present invention in accordance with the present invention. The cross-sectional view shown in FIG. 3F is taken along line 3F—3F In FIG. 6. As shown in FIG. 6, when mask 354 has been patterned and poly2 layer 352 has been etched to form merged gate/word line 356, insulation layer 350 is exposed.

Following this, mask 354 is removed, and the wafer is implanted with a n-type dopant to form n+ source and drain regions 360 and 362, and to dope merged gate/word line 356. Following this, the method of the present invention continues with conventional back-end processing steps.

Figure 7A:
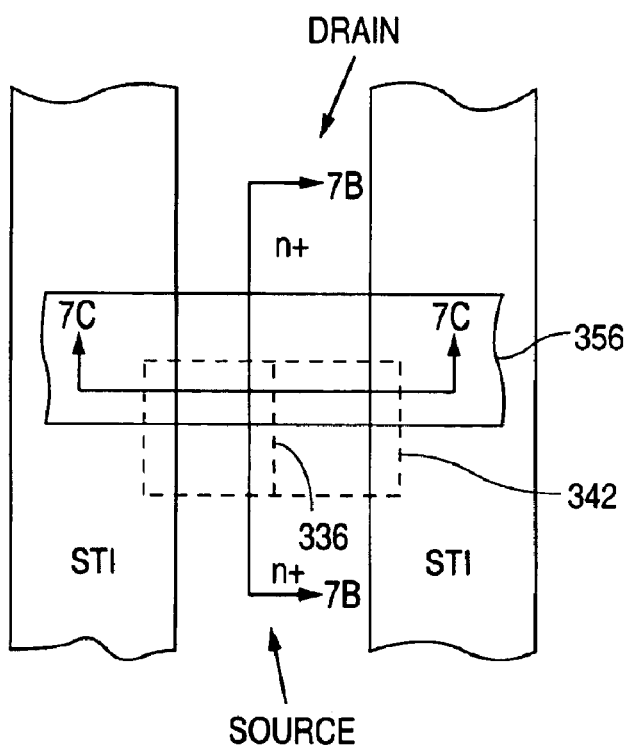
FIGS. 7A–7C illustrate the structure of a memory cell 300 following the formation of source and drain regions 360 and 362.
Figure 7B:
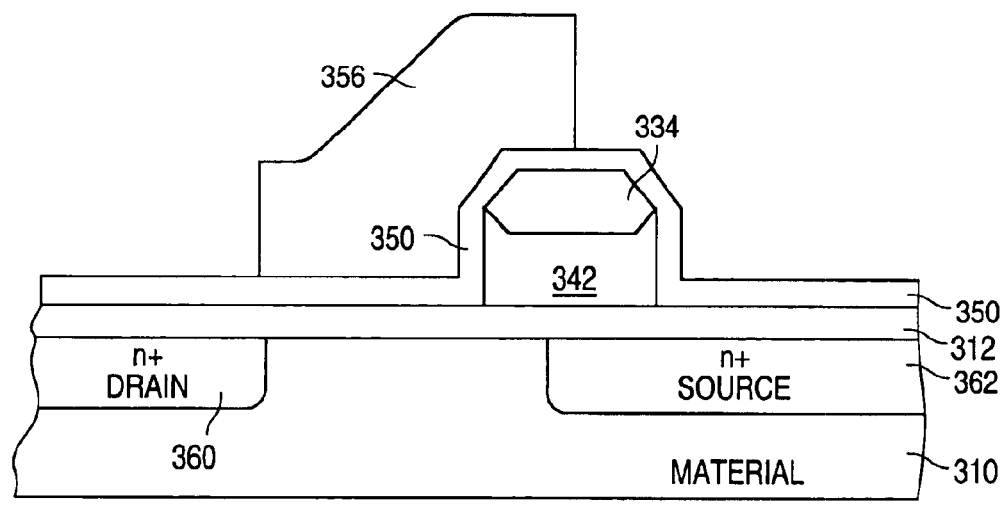
Figure 7C:
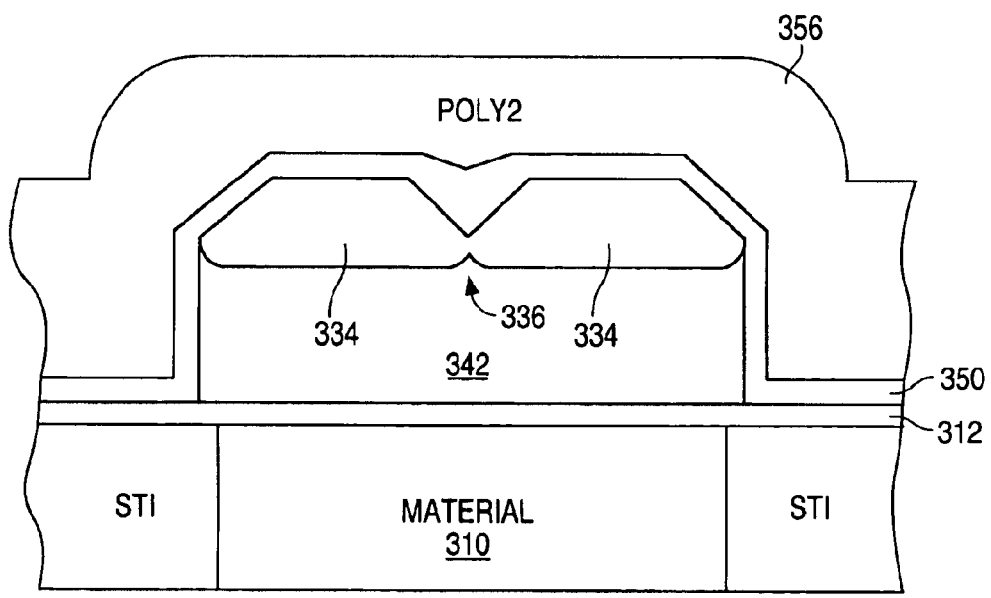

FIGS. 7A–7C show the structure of a memory cell 300 following the formation of source and drain regions 360 and 362. FIG. 7A shows a plan view that illustrates memory cell 300 in accordance with the present invention. FIG. 7B shows a cross-sectional view taken along line 7B—7B of FIG. 7A. FIG. 7C shows a cross-sectional view taken along line 7C—7C of FIG. 7A.

As shown in FIGS. 7A–7C, cell 300 is similar to cell 200. Cell 300 differs from cell 200 in that merged gate 356 is formed over insulation layers 312 and 350, while merged gate 226 is formed over gate oxide layer 220. Cell 200, however, represents the case where both layers 312 and 350 are formed from the same material, such as oxide.

Thus, a split-gate FLASH memory cell with a tip in the middle of the floating gate, and a method of forming the memory cell, have been described. It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A method of forming a memory cell on a semiconductor material of a first conductivity type, the method comprising the steps of:

forming a layer of first insulation material on the semiconductor material;

forming a layer of first conductive material on the layer of first insulation material;

defining a first region on the layer of first conductive material, and a second region on the layer of first conductive material, the first region being spaced apart from the second region;

etching the first region of the layer of first conductive material to form a first surface of the layer of first conductive material, and the second region of the layer of first conductive material to form a second surface of the layer of first conductive material;

etching the layer of first conductive material to form a floating gate, the floating gate having side wall surfaces and the first and second surfaces;

forming a layer of second insulation material on the layer of first insulation material, on the side wall surfaces of the floating gate, and over the first and second surfaces of the floating gate; and forming a merged gate on the layer of second insulation material over the floating gate.

2. The method of claim 1 wherein the layer of first insulation material includes a first region, a second region, and a third region, the floating gate is formed over only the first region, and the merged gate is formed over the first, second, and third regions.

3. The method of claim 2 and further comprising the step of oxidizing the first surface and the second surface to form a layer of oxide on the first surface and the second surface.

4. The method of claim 3 wherein the layer of second insulation material is formed on the layer of oxide.

5. The method of claim 4 wherein the layer of oxide is formed before the etching step that forms the floating gate.

6. The method of claim 5 wherein the oxidizing step causes the first surface to contact the second surface.

7. The method of claim 1 and further comprising the step of oxidizing the first surface and the second surface to form a layer of oxide on the first surface and the second surface.

8. The method of claim 7 wherein the layer of second insulation material is formed on the layer of oxide.

9. The method of claim 8 wherein the layer of oxide is formed before the etching step that forms the floating gate.

10. The method of claim 9 wherein the oxidizing step causes the first surface to contact the second surface.

11. The method of claim 1, wherein the step that forms the layer of second insulation material increases a thickness of the layer of first insulation material.

12. A method of forming a memory cell on a semiconductor material of a first conductivity type, the method comprising the steps of:

forming a layer of first insulation material on the semiconductor material;

forming a layer of first conductive material on the layer of first insulation material, the layer of first conductive material having a top surface;

forming a mask on the layer of first conductive material to define a first region on the layer of first conductive material, and a second region on the layer of first conductive material, the first region being spaced apart from the second region;

etching the first region of the layer of first conductive material to form a first opening in the top surface, and the second region of the layer of first conductive material to form a second opening in the top surface, the first and second openings not exposing the layer of first insulation material, and forming first and second surfaces;

oxidizing the first and second surfaces to form an oxide region in the first and second openings, the oxidizing step causes causing the first surface to contact the second surface; and removing the mask.

13. A method of forming a memory cell on a semiconductor material of a first conductivity type, the method comprising the steps of:

forming a layer of first insulation material on the semiconductor material;

forming a layer of first conductive material on the layer of first insulation material, the layer of first conductive material having a top surface;

forming spaced-apart first and second openings in the top surface, the first and second openings not exposing the layer of first insulation material, and forming first and second surfaces;

forming an isolation material in the first and second openings;

etching the layer of first conductive material to form a floating gate, the floating gate having side wall surfaces and the first and second surfaces;

forming a layer of second insulation material on the layer of first insulation material, on the side wall surfaces of the floating gate, and over the first and second surfaces of the floating gate; and forming a merged gate on the layer of second insulation material over the floating gate.

14. The method of claim 13 wherein the layer of first insulation material includes a first region, a second region, and a third region, the floating gate is formed over only the first region, and the merged gate is formed over the first, second, and third regions.

15. The method of claim 13 wherein the layer of second insulation material is formed on the isolation region.

16. A method of forming a memory cell on a semiconductor material, the semiconductor material having a conductivity type, the method comprising the steps of:

forming a layer of insulation material to contact the semiconductor material, the layer of insulation material having a substantially uniform thickness and a substantially planar top surface;

forming a layer of conductive material on the top surface of the layer of insulation material, the layer of conductive material having a top surface;

etching the layer of conductive material to form spaced-apart first and second openings in the top surface, the first opening having a first surface, the second opening having a second surface, the first and second openings not exposing the layer of insulation material; and oxidizing the first and second surfaces to form an oxide region in the first and second openings, the oxidizing step causing the first surface to contact the second surface.

17. The method of claim 16 and further comprising the steps of:

etching the layer of conductive material to form a conductive structure;

forming a layer of isolation material that contacts the conductive structure and the oxide region; and forming a conductive region that contacts the layer of isolation material, the conductive region not contacting the conductive structure.

* * * * *

UNITED STATES PATENT AND TRADEMARK OFFICE
CERTIFICATE OF CORRECTION

PATENT NO. : 6,861,306 B1
DATED : March 1, 2005
INVENTOR(S) : Hopper et al.

It is certified that error appears in the above-identified patent and that said Letters Patent is hereby corrected as shown below:

Title page, Item [54] and Column 1, line 1,
after "SPLIT-GATE", insert -- FLASH --.
Item [56], References Cited, U.S. PATENT DOCUMENTS, delete "U.S. Patent No. 6,528,894" and replace with -- U.S. Patent No. 6,528,844 --.

Column 4,
Line 12, delete "Is" and replace with -- is --.

Column 6,
Line 9, before "FIG. 6", delete "In" and replace with -- in --.

Column 7,
Line 52, delete "causes".

Signed and Sealed this

Seventeenth Day of May, 2005

JON W. DUDAS
*Director of the United States Patent and Trademark Office*